United States Patent
Masleid et al.

(10) Patent No.: US 7,053,680 B2
(45) Date of Patent: May 30, 2006

(54) COMPLEMENT RESET BUFFER

(75) Inventors: Robert P. Masleid, Monte Soreno, CA (US); Christophe Giacomotto, Mountain View, CA (US)

(73) Assignee: Fujitsu Limited, Kawasaki (JP)

( * ) Notice: Subject to any disclaimer, the term of this patent is extended or adjusted under 35 U.S.C. 154(b) by 782 days.

(21) Appl. No.: 10/170,737

(22) Filed: Jun. 12, 2002

(65) Prior Publication Data

US 2003/0231713 A1    Dec. 18, 2003

(51) Int. Cl.
*H03K 3/00*    (2006.01)

(52) U.S. Cl. ...................................... 327/112; 327/387

(58) Field of Classification Search ................ 327/261, 327/376, 377, 387, 112
See application file for complete search history.

(56) References Cited

U.S. PATENT DOCUMENTS

| | | | |
|---|---|---|---|
| 5,610,548 A | 3/1997 | Masleid | 327/378 |
| 5,614,845 A | 3/1997 | Masleid | 326/93 |
| 5,656,963 A | 8/1997 | Masleid et al. | 327/297 |
| 5,675,273 A * | 10/1997 | Masleid | 327/156 |
| 5,717,343 A * | 2/1998 | Kwong | 326/27 |
| 5,894,419 A | 4/1999 | Galambos et al. | 716/6 |
| 5,926,050 A | 7/1999 | Proebsting | 327/170 |
| 6,025,738 A | 2/2000 | Masleid | 326/83 |
| 6,323,706 B1 | 11/2001 | Stark et al. | 327/175 |
| 6,366,115 B1 | 4/2002 | DiTommaso | 326/32 |
| 6,426,652 B1 | 7/2002 | Greenhill et al. | 326/183 |
| 6,466,063 B1 | 10/2002 | Chen | 327/112 |
| 6,630,851 B1 * | 10/2003 | Masleid | 327/165 |
| 2003/0011413 A1 | 1/2003 | Masleid | 327/165 |

OTHER PUBLICATIONS

Stojanovic, V. and Oklobdzija, V. "Comparative Analysis of Master-Slave Latches and Flip-Flops for High-Performance and Low-Power Systems", IEEE Journal of Solid-State Circuits, vol. 34, No. 4, Apr. 1999, pp. 536-548.

* cited by examiner

Primary Examiner—Timothy P. Callahan
Assistant Examiner—Hai L. Nguyen
(74) Attorney, Agent, or Firm—Fenwick & West LLP

(57) ABSTRACT

A system and method for increasing speed and efficiency of data buffers is described. A complement reset buffer is provided comprising two pulse generators and an output stage. The first generator responds to a rising edge in a data signal and the second generator responds to a falling edge in a data signal. Each generator is disabled by looping its output back to its input. A reset is also provided for each generator to re-enable the generator during a complement transition in the data signal. A method describing the optimization of the buffer is also described.

27 Claims, 11 Drawing Sheets

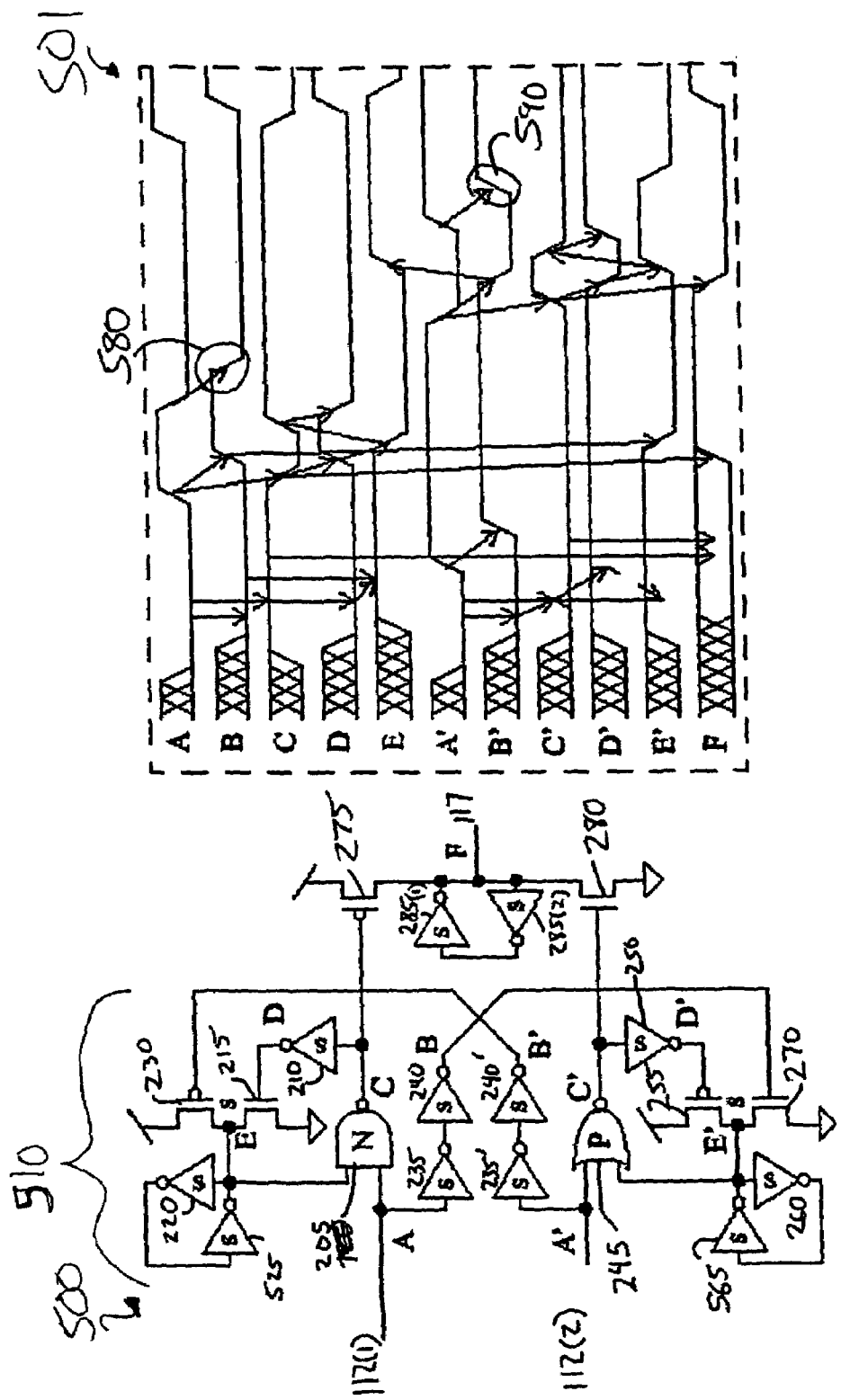

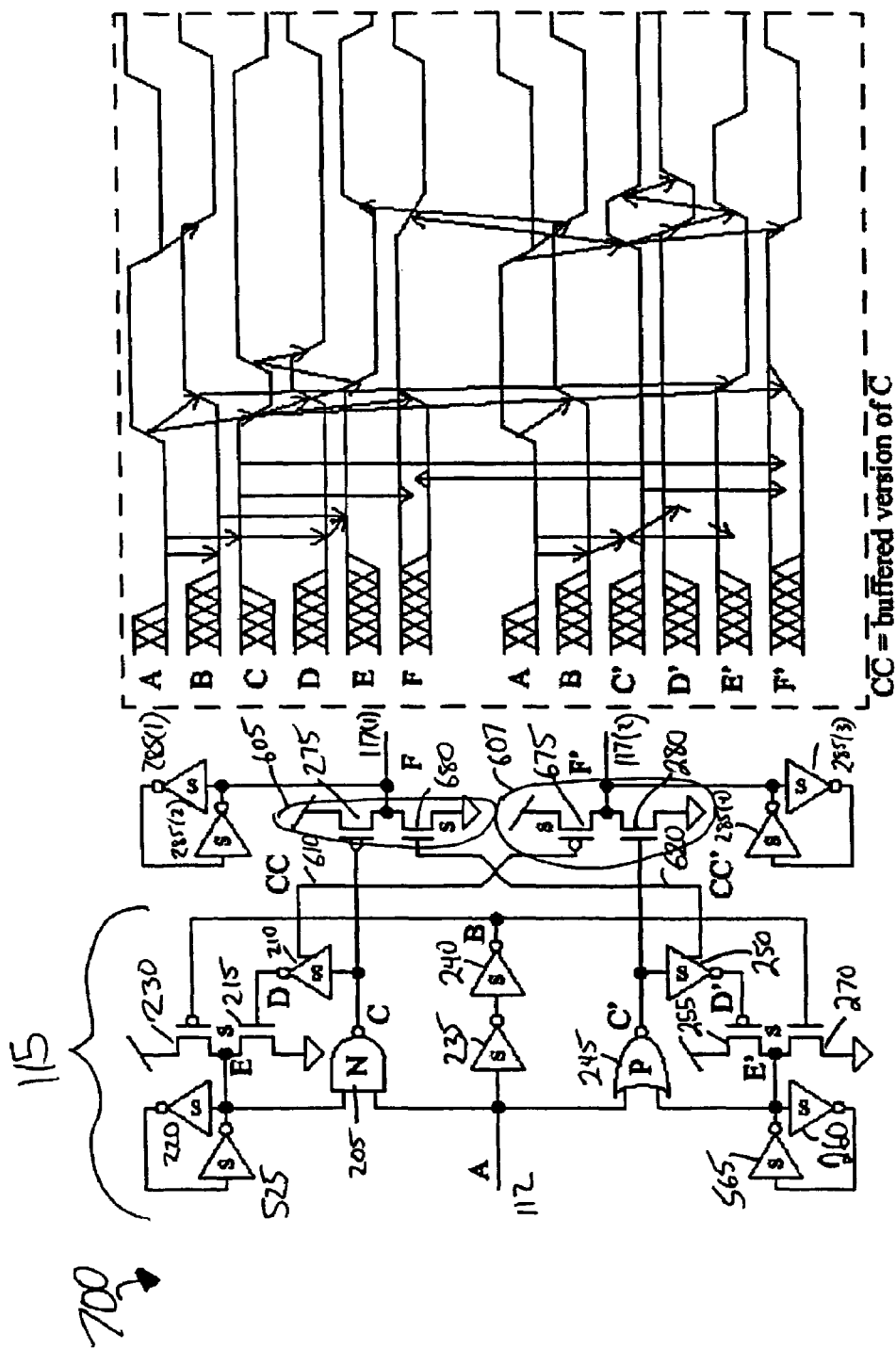

COMPLEMENT RESET BUFFER

RELATED APPLICATIONS

This application is related to the U.S. patent application Ser. No. 10/170,948 of Robert P. Masleid and Christophe Giacomotto, entitled "Complement Reset Latch," filed on Jun. 12, 2002, now U.S. Pat. No. 6,577,176.

BACKGROUND OF THE INVENTION

1. Field of the Invention

The present invention relates generally to systems and methods for distributing a data signal along a "long wire" in an integrated circuit.

2. Description of Background Art

There is an increasing interest in high-speed microprocessors, such as microprocessors with a clock cycle frequency greater than one Gigahertz. In these microprocessors it is desirable to communicate data signals as quickly as possible. However, as clock cycle frequencies increase, the transition times (rise and fall times) become more important. It is advantageous to have the data signal transition from ground to a logic logical "1" and vice versa as fast as possible. Shorter transition times allow more time for the receiving logic to process the data signal. This may lead to overall faster systems with higher frequencies.

In conventional integrated circuits, data signals may degrade when transmitted over a distance. Degradation may take the form of increasingly slower transition times, effectively spreading out the data signal. Often, the data must be transmitted farther than can be transmitted without signal boost or other transmission assistance. To maintain data integrity and speed, a buffer, or repeater, is used to boost and amplify the data signal as it propagates down a long wire. This helps maintain relatively fast transition times for the data signal.

In conventional integrated circuits, a buffer is implemented as one or two inverters in series. In a conventional CMOS design topology, the inverters are each formed from an NFET and a PFET transistor connected in series between a logical "1" power bus and ground (logical "0"). While effective at aiding the data signal along a long wire, these conventional buffers have a basic inefficiency. Because of the simple design, both transistors in each inverter must be rather large in order to provide enough current to propagate the data signal along the long line in short transition times. However, in such conventional designs, there is a period of time around a transition when both the NFET and the PFET may be active as one FET switches on and the other FET switches off. During this time of dual activity, one of the FETs acts as a parasitic load on the other, slowing its switching, as well as creating a short from power to ground. This short is commonly known as a crowbar current. Both the crowbar current and the parasitic load cause the inverter to be slower in transitioning from a logical "0" to a logical "1" and vice versa. This increases the rise and fall times, and adds latency to the system. Furthermore, it is inefficient from an energy-usage standpoint.

Other conventional buffer topologies include using a split drive buffer that includes an inverter pulse generator for each edge of an input data signal and a PFET and NFET in series to drive an output signal. For instance, one pulse generator focuses on recognizing a logical "0" to logical "1" transition and reacts quickly to drive the output PFET. The second inverter pulse generator focuses on the logical "1" to logical "0" transition to drive the output NFET. Each pulse generator relies on the delay through an inverter to end the pulse. Thus, each pulse generator turns on its associated PFET or NFET for a short time, creating a pulse-controlled output. By utilizing a pulse, the PFET and NFET are prevented from being switched on together, thus eliminating the parasitic load and crowbar current inefficiencies found in the single or double inverter buffer described above. Since the FETs are turned on for a short time only, the output from the buffer is typically tri-state. In some circuits, a keeper circuit may be used to stabilize the output while the buffer is in tri-state.

Additional modifications to this design include using a skewed gain chain after the pulse generator in order to provide a higher current to turn on the PFET and NFET quickly. However, in both configurations, the inverter pulse generators introduce some delay penalty in the system. The inverter pulse generators also create a higher input capacitance with associated higher input power requirement. In longer data signal paths, this may require the buffers to be placed closer together to avoid excessive data signal degradation due to the additional capacitance and power requirements. Finally, inverter pulse generators fail to operate at slow input edge rates (i.e. when rise and fall times are long). As noted above, this further limits the effectiveness of the buffers, and requires additional buffers to be placed on a long wire in order to ensure that the transition times do not increase beyond the ability of the buffer to respond to the transition.

Therefore, what is needed is a data signal buffer which: 1.) decreases transition times; 2.) is energy efficient; 3.) can correctly respond to data signals with a long transition time; and 4.) requires installation of fewer buffers for a given long-wire length.

SUMMARY OF THE INVENTION

The present invention is a complement reset buffer for use on long lines or when high-amplification is needed, that comprises a rising-edge pulse generator, a rising-edge loop pulse generator, a rising-edge loop keeper circuit, a rising-edge reset, a falling-edge pulse generator, a falling-edge loop pulse generator, a falling-edge loop keeper circuit, a falling-edge reset, a reset generator and an output stage.

The buffer receives a data signal and the rising-edge pulse generator generates a rising-edge pulse in response to a rising edge in the data signal. The rising-edge pulse is fed to the output stage to drive the output to a similar logical value as the input. The rising-edge pulse is also provided to the rising-edge loop pulse generator which delays the pulse and provides the delayed pulse to the rising-edge loop keeper circuit which in turn relays the delayed pulse back to the rising-edge pulse generator. The delayed pulse triggers the rising-edge pulse generator to end the pulse, and triggers the rising-edge loop keeper circuit to disable the rising-edge pulse generator. The reset generator provides the rising-edge reset with a reset signal corresponding to a falling edge (the complement) in the data signal. The rising-edge reset disables the rising-edge loop keeper circuit and re-enables the rising-edge pulse generator in time to respond to a subsequent rising edge in the input data.

The falling-edge generator generates a falling-edge pulse in response to a falling edge in the data signal and cooperates with its associated falling-edge elements to provide similar functionality as the rising-edge circuitry. To reset, the falling-edge reset receives a reset signal from the reset generator corresponding to a rising edge of the data input.

In one embodiment the input may be passed through a series of slow inverters to maintain an output consistent with the input once the generators have ended their pulses. In another embodiment, the output stage may include an output keeper circuit to hold the last logical value asserted on the output line until overdriven by a signal from the pulse generators.

In one embodiment, the buffer may be a level-in-level-out buffer. In another embodiment, the buffer may be a pulse-in-level-out buffer. In another embodiment, the buffer may be a level-in-pulse-out buffer. In another embodiment, the buffer may be a pulse-in-pulse-out buffer.

According to the present invention, the complement reset buffer decreases transition times in the data while increasing speed approximately 13% over conventional buffers while saving approximately 5% in power efficiency.

BRIEF DESCRIPTION OF THE DRAWINGS

FIGS. 5a and 5b are, respectively, schematic and timing diagrams for a pulse-in-level-out buffer according to the present invention.

FIGS. 7a and 7b are, respectively, schematic and timing diagrams for a level-in-pulse-out buffer according to the present invention.

DESCRIPTION OF THE INVENTION

The present invention relates to a complement reset buffer for use in an integrated circuit to facilitate the propagation of data signals across a long wire. In conventional integrated circuit technology, data signals which propagate across long wires typically degrade due to fan-out, resistance, capacitance, and power problems which increase the transition time for a rising or falling edge of a data signal. As transition times increase, the system must operate at a slower clock speed in order to allow the data signal to fully transition so that valid data may be processed. In conventional integrated circuit technologies, wires longer than 1 mm may be considered long. This is especially true for systems operating at higher clock speeds. In order to preserve the data integrity, and to maintain acceptable transition times, buffers, or repeaters, are often placed periodically along a long wire in order to amplify the data signal as well as to maintain fast transition times.

Figure 1:
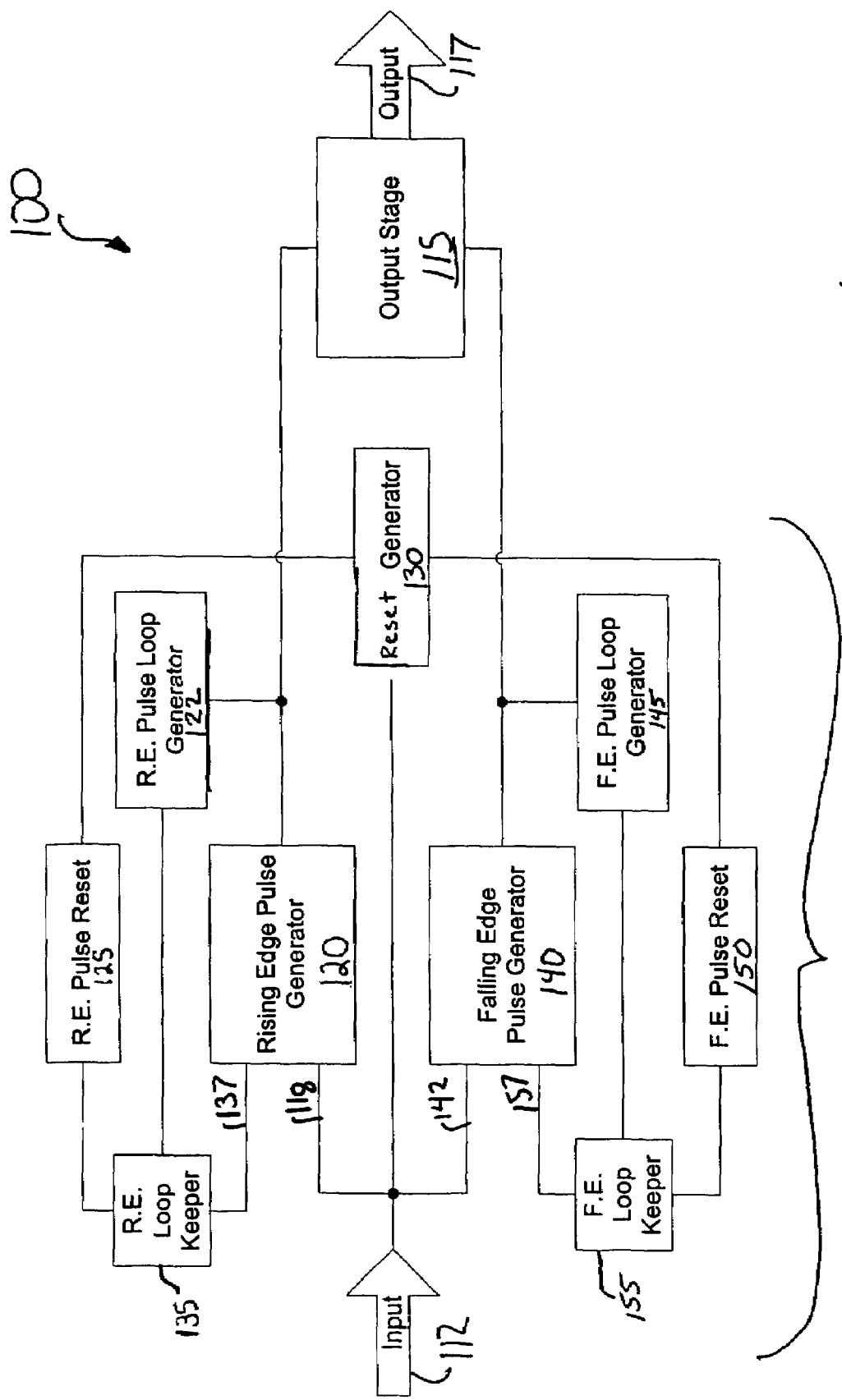
FIG. 1 is a high-level block diagram of one embodiment of the present invention.

FIG. 1 illustrates a high-level block diagram of one embodiment 100 of the present invention. The buffer 100 generally includes a pulse stage 110 where pulses are generated from an input 112, and an output stage 115 where the pulses are used to create an output 117 that corresponds to the input 112. The pulse stage 110 may also be divided into two separate circuits. The first circuit is configured to react to the rising edge of input 112 and outputs a rising-edge pulse to the output stage 115 to trigger a transition in the output 117. The rising-edge pulse ends before a falling edge appears on the input 112. The second circuit is configured to react to the falling edge of input 112 and outputs a falling-edge pulse to the output stage 115 to trigger a transition in the output 117. The second circuit ends the falling-edge pulse before a rising edge appears on the input 112.

In the remainder of the description, the term "complement" will be used to distinguish between the first and second circuits, as well as between a rising and falling edge. The term "complement" is not intended to indicate any particular logic value but merely provides a convenient manner in which to discuss the operation of the two circuits in the buffer 100.

The first circuit includes a rising-edge pulse generator 120, a rising-edge pulse loop generator 122, a rising-edge loop keeper 135 and a rising-edge pulse reset 125. Additionally, the first circuit receives a reset signal from a reset generator 130.

In operation, the first circuit receives the data on input 112 at a first input 118, and outputs a rising-edge pulse to drive the output stage 115 when a rising edge is detected. In order to avoid crowbar current and other problems associated with a conventional buffer, the rising-edge pulse must end before a falling edge is detected on input 112, at which point the second circuit operates. In order to shut off the rising-edge pulse, the first circuit loops the rising-edge pulse back through the rising-edge pulse loop generator 122, the rising-edge loop keeper circuit 135, and back into a second input 137 on the rising-edge pulse generator 120. Once the looped pulse is received, the generator 120 stops outputting the rising-edge pulse. In order to set the width of the rising-edge pulse, the rising-edge pulse loop generator 122 is configured to receive the rising-edge pulse, and to delay it, before looping it back to the generator 120.

The use of the pulse loop provides advantages over conventional inverter-based pulse generators. As noted above, inverter-based pulse generators cannot respond adequately to data with slow transition times. This is primarily due to the fact that in inverter-based pulse generators, the shut-off signal is generated from the input, and may get to the generator before the pulse has been generated. However, the present invention advantageously generates its shut-off signal, i.e. the looped pulse, from the output of the pulse generator 120, ensuring that the generator 120 has ample time to react to the slow transition time. Additionally, the first circuit has only one active device on the input 112, compared to an inverter-based pulse generator which has both the generator and the inverter tied to the input. By reducing the number of components on the input 112, the first circuit avoids the fan-out and noise problems commonly associated with inverter-based pulse generators.

While the use of a pulse loop is advantageous in receiving a variety of signals with a wide range of transition times, care must be taken to avoid having the generator 120 oscillate while the data input 112 remains high. It is the function of the rising-edge loop keeper circuit 135 to effectively create a one-shot pulse generator. This is done by breaking the pulse loop after the initial delayed pulse has passed through the loop keeper circuit 135. The loop keeper circuit 135 subsequently holds the second input 137 to the generator 120 at a value which keeps the generator 120 from outputting additional pulses. It is generally preferable to have a first circuit which may react to all incoming rising edges on input 112. Therefore, rising-edge pulse reset 125 is configured to receive a reset signal from reset generator 130. The reset signal triggers rising-edge pulse reset 125 to disengage the rising-edge loop keeper circuit 135 and to put a value on the second input 137 of the generator 120 which will enable it to react to a subsequent rising edge in the data input 112.

Typically, a buffer is configured to react only once to each rising or falling edge in the data at input 112. Thus, reset generator 130 is configured to wait for a falling edge, i.e. the complement of a rising edge, before generating the reset signal for rising-edge pulse reset 125. The reset generator 130 advantageously uses the complement on input 112 to ensure that rising-edge pulse generator 120 is not reset until the data input is in a logical "0" state. By using the complement to trigger a reset, the present invention avoids requiring external control or clock signals to implement the reset. Additionally, this allows the buffer to run at whatever rate the data runs at since the data itself effectively resets the buffer at each transition. Further, active power of this circuit goes to zero when data activity goes to zero. This is advantageous for power-constrained applications.

The second circuit acts as the complement of the first circuit and is configured to react to the falling edge of input 112. The general operation and structure of the second circuit is similar to the operation and structure of the first circuit. The second circuit includes a falling-edge pulse generator 140 which receives input 112 at a first input 142, and outputs a falling-edge pulse to the output stage 115 and to a falling-edge pulse loop generator 145 in response to a detected falling edge on the input 112. The falling-edge pulse loop generator 145 delays the falling-edge pulse and outputs a delayed falling-edge pulse to a falling-edge loop keeper circuit 155. The falling-edge loop keeper circuit 155 completes the loop by sending the delayed falling-edge pulse into a second input 157 on the falling-edge pulse generator 140. The falling-edge loop keeper circuit 155 is triggered by the delayed falling-edge pulse and effectively shuts off further pulse generation in falling-edge pulse generator 140. A falling-edge pulse reset 150 receives a reset signal from reset generator 130 and resets the falling-edge loop keeper circuit 155 and the falling-edge pulse generator 140 so that the generator 140 can respond to a subsequent detected falling edge in input 112. The reset generator 130 provides the reset signal to the falling-edge pulse reset 150 during the second circuit's data complement, i.e. a logical "1" on input 112.

Figure 2:
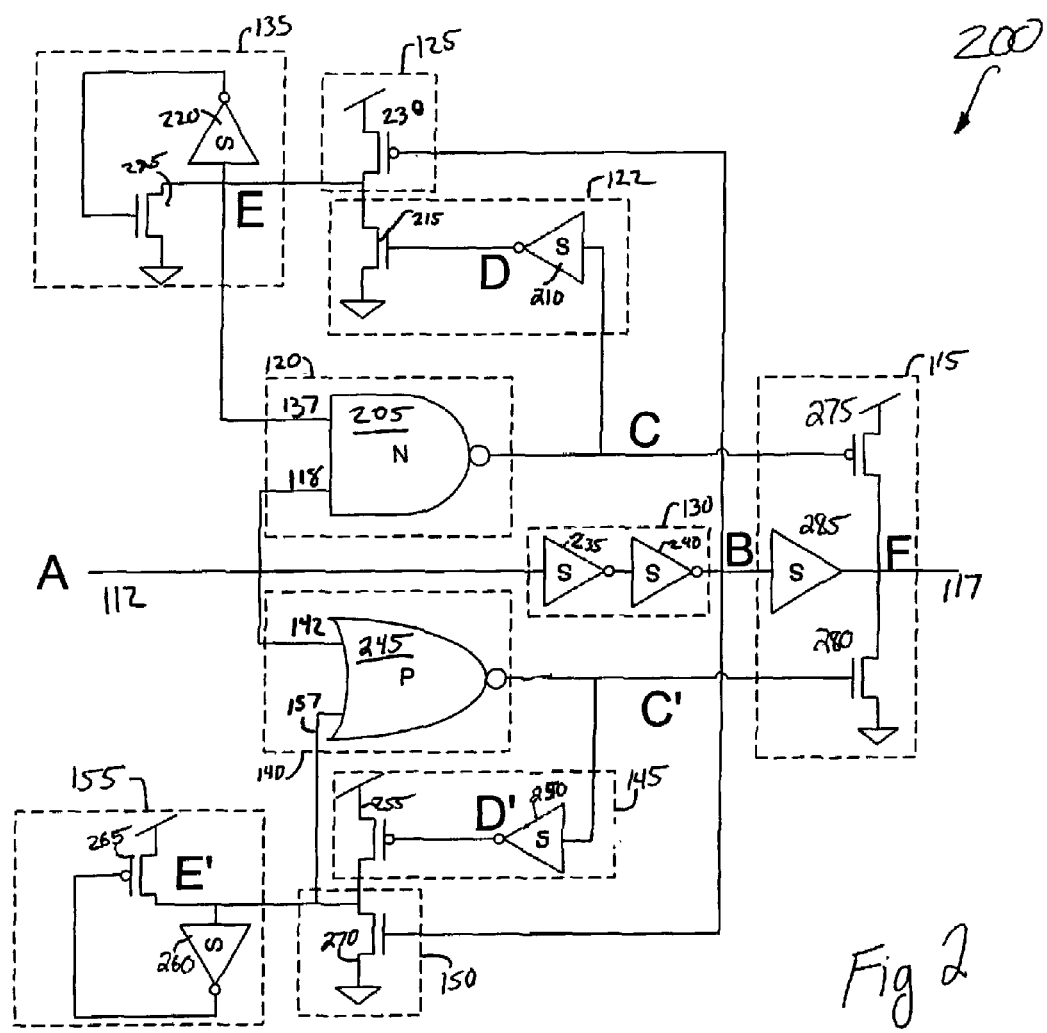
FIG. 2 is a schematic view of a level-in-level-out buffer according to the present invention.

FIG. 2 illustrates a schematic view of a buffer 200 according to the present invention. Buffer 200 shows the buffer 100 of FIG. 1 with specific structure for each element. FIG. 2 includes the reference letters "A"–"E" and "B'"–"D'" to indicate points in the circuit which are examined for discussion later herein with reference to FIG. 9a. Additionally, the components in FIG. 2 are marked with an "S", "N" or "P". The inverters marked with an "S" indicate "small" inverters, which are slow and do not consume a lot of power or space within the buffer 200. Devices marked with an "N" indicated devices which are skewed to react quickly to a rising edge in a signal. Typically, these devices are slower when reacting to a falling edge. Conversely, devices marked with a "P" are skewed to react quickly to a falling edge in a signal and do not react quickly to a rising edge.

In this embodiment the rising-edge pulse generator 120 includes an "N"-skewed NAND gate 205. As noted above, the NAND gate 205 is skewed to react quickly to a rising edge in the data input 112. The NAND gate 205 has a first input 118 and a second input 137. The first input 118 receives the data from input 112 and the second input 137 ultimately receives the looped pulse from the rising-edge loop keeper circuit 135.

The rising-edge pulse loop generator 122 includes a "small" inverter 210 coupled to the output of the NAND gate 205 to receive the pulse, and to the gate of a NFET transistor 215. The NFET 215 has its drain coupled to the ground plane of the integrated circuit, and its source is coupled to the rising-edge loop keeper circuit 135 and to the second input 137 of the NAND gate 205. In this embodiment, the loop generator 122 first inverts and delays the pulse in the small inverter 210, and then inverts and delays it again through the NFET 215. Careful examination of the circuit reveals that by using only the NFET 215 instead of a complete inverter, the pulse loop is broken whenever the output from the NAND gate 205 is a logical "1". Thus, once the NAND gate 205 detects a rising edge and generates a logical "0", it passes back around to input the logical "0" on the second input 137 of the NAND gate 205 thereby shutting it "off" causing it to generate a logical "1". This logical "1" then breaks the loop by turning off NFET 215 and, assuming that the rising-edge pulse reset 125 is not active, the second input 137 to the NAND gate 205 would float at an indeterminate level.

The rising-edge loop keeper circuit 135 is provided to maintain the second input 137 of the NAND gate 205 at a logical "0" once the loop is broken. Rising-edge loop keeper circuit 135 includes a "small" inverter 220 with an input coupled to the source of NFET 215, and whose output is coupled to the gate of a NFET transistor 225. The NFET 225 drain is grounded and the source is coupled back to the inverter 220 input, and to the second input 137 of the NAND gate 205. When a logical "0" is asserted on the source of the NFET 215 in the pulse loop generator 122 (in response to the NAND gate 205 detecting a rising edge), the keeper circuit 135 turns on to maintain the logical "0" on the second input 137 of the NAND gate 205 until reset. The keeper circuit 135 typically comprises "weak" components to allow the components to be over-driven by other components in the system, e.g. the pulse reset 125.

It is the function of the rising-edge pulse reset 125 to assert a logical "1" at the input of the keeper inverter 220 in order to reset the first circuit for the next rising edge. By asserting a logical "1", the keeper circuit is over-driven and turns off, leaving the second input 137 of the NAND gate 205 under the control of the pulse reset 125. The pulse reset 125 comprises a PFET transistor 230 whose source is connected to a logical "1" and whose drain is connected to the input of inverter 220 and to the second input 137 of the NAND gate 205. The gate of PFET 230 is coupled to the output of reset generator 130 and the PFET 230 is turned on when it receives a logical "0" from the reset generator 130. A reset signal of logical "0" corresponds to the complement falling edge condition in the data input 112. As noted above, the pulse reset 125 asserts a logical "1" on the NAND gate 205 when the second circuit is active after a falling edge and before the next rising edge activates NFET 215.

The reset generator 130 comprises two small inverters 235, 240 which are wired in series such that inverter 235 receives input from data input 112, and provides the inverted signal to the input of inverter 240, which in turn provides the double-inverted signal to rising-edge pulse reset 125 and to falling-edge pulse reset 150. Thus in this embodiment the reset generator 130 acts to delay the input signal on its way to activating and deactivating the pulse resets 125, 150.

Note, in order to avoid excessive delay and crowbar current, the latency of the input 112 passing through the reset generator 130 should be just less than the latency of the input 112 passing through the NAND gate 205 and inverter 210. A low-duration tri-state condition on "E" is acceptable; leakage will not have time to significantly change the voltage on "E". This is reflected in the timing diagram 900 at 930 by indicating that both D and B transition at nearly the same time.

The second circuit is structured in a similar manner as the first circuit, with all the transistors now their complements (e.g., PFETs are NFETs and vice versa) and utilizing a two-input NOR gate 245 for the falling-edge pulse generator 140. More specifically, in this embodiment the NOR gate 245 is "P"-skewed to react quickly to a falling edge in the data input 112. The first input 142 of the NOR gate 245 receives the data from input 112 and the second input 157 ultimately receives the looped pulse from the falling-edge loop keeper circuit 155.

The falling-edge pulse loop generator 145 includes a "small" inverter 250 coupled to the output of the NOR gate 245 to receive the pulse, and to the gate of a PFET transistor 255. The PFET 255 has its source coupled to a supply representative of a logical "1" and its drain is output to the falling-edge loop keeper circuit 155 and to the second input 157 of the NOR gate 245. In this embodiment, the loop generator 145 first inverts and delays the pulse in the small inverter 250, and then inverts and delays it again through the PFET 255. Careful examination of the circuit reveals that by using only the PFET 255 instead of a complete inverter, the pulse loop is broken whenever the output from the NOR gate 245 is a logical "0". Thus, once the NOR gate 245 detects a falling edge and generates a logical "1", it passes back around to supply the logical "1" on the second input 157 to the NOR gate 245 thereby shutting it "off" causing it to generate a logical "0". This logical "0" then breaks the loop, and assuming that the falling-edge pulse reset 150 is not active, the second input 157 to the NOR gate 245 would float at an indeterminate level.

The falling-edge loop keeper circuit 155 is provided to maintain the second input 157 of the NOR gate 245 at a logical "1" once the loop is broken. Falling-edge loop keeper circuit 155 includes a "small" inverter 260 with an input coupled to the drain of PFET 255, and whose output is coupled to the gate of a PFET transistor 265. The PFET 265 source is connected to a logical "1" and the drain is coupled back to the inverter 260 input, and to the second input 157 of the NOR gate 245. When a logical "1" is asserted on the drain of the PFET 255 in the pulse loop generator 145 (in response to the NOR gate 245 detecting a falling edge), the keeper circuit 155 turns on to maintain the logical "1" on the second input 157 of the NOR gate 245 until reset. The keeper circuit 155 is typically comprised of "weak" components to allow the components to be over-driven by other components in the system.

It is the function of the falling-edge pulse reset 150 to assert a logical "0" at the input of the keeper inverter 260 in order to reset the second circuit for the next falling edge. By asserting a logical "0", the keeper circuit 155 is over-driven and turns off, leaving the second input 157 of the NOR gate 245 under the control of the pulse reset 150. The pulse reset 150 is comprised of a NFET transistor 270 whose drain is grounded and whose source is connected to the input of inverter 260 and to the second input 157 of the NOR gate 245. The gate of NFET 270 is coupled to the output of reset generator 130 and the NFET 270 is turned on when it receives a logical "1" from the reset generator 130. A reset signal of logical "1" corresponds to a rising edge condition in the data input 112. As noted above, the pulse reset 150 only asserts a logical "0" on the NOR gate 245 when the first circuit is active, after a rising edge and before the next falling edge activates PFET 270.

The output stage 115 includes a PFET transistor 275, a NFET transistor 280 and a weak keeper buffer 285. The PFET 275 has its source coupled to a logical "1", the gate is coupled to the output of NAND gate 205, and the drain is coupled to output 117 and the source of NFET 280. The NFET 280 has the gate coupled to the NOR gate 245 to receive the falling-edge pulse, and has the drain coupled to ground. The FETs 275, 280 switch on when the first or second circuit, respectively, is active and generates a pulse. As noted above, if both FETs 275, 280 are "on" simultaneously, a crowbar current is formed and performance and efficiency of the buffer is degraded. In order to avoid this, the pulses have a width long enough to activate their respective FET 275, 280, but not so long as to allow both FETs 275, 280 to be active at the same time. In the interim between a pulse and its complement pulse, both FETs 275, 280 are inactive and the output 117 is not driven. To avoid a tri-state condition, small buffer 285 is provided to slowly transfer the input 112 to the output 117 and to hold it there until overdriven by one of the FETs 275, 280 switching on. Ideally, the buffer 285 asserts the value of input 112 before the active FET 275 or 180 switches off.

Thus the operation of the output stage 115 may be considered in two stages. The primary stage involves the FETs 275, 280 and is configured to transfer the input signal 112 to the output 117 as quickly as possible, and with higher gain and faster transitions. As discussed above, this primary stage must go idle in between transitions. A secondary stage comprising the weak buffer 285 takes over in maintaining the input signal 112 on the output 117 until a new transition occurs. In this manner the buffer can achieve quick response and improved transition times in its output 117 as well as avoid a tri-state condition when the FETs 275, 280 switch off.

Buffer 200 utilizes a single input 112 and a single output 117. This particular buffer scheme is known as a Level-In-Level-Out buffer. Nearly all VLSI logic circuits are LILO. LILO requires only a single wire to carry a logic signal from one circuit to another. Furthermore, LILO is noise robust because noise pulses eventually decay and the correct levels eventually appear at the circuit outputs. Additionally, LILO is low energy since there is only one transition for each change in logic state. This style buffer is commonly used for single-wire data transmission.

Figure 9A:
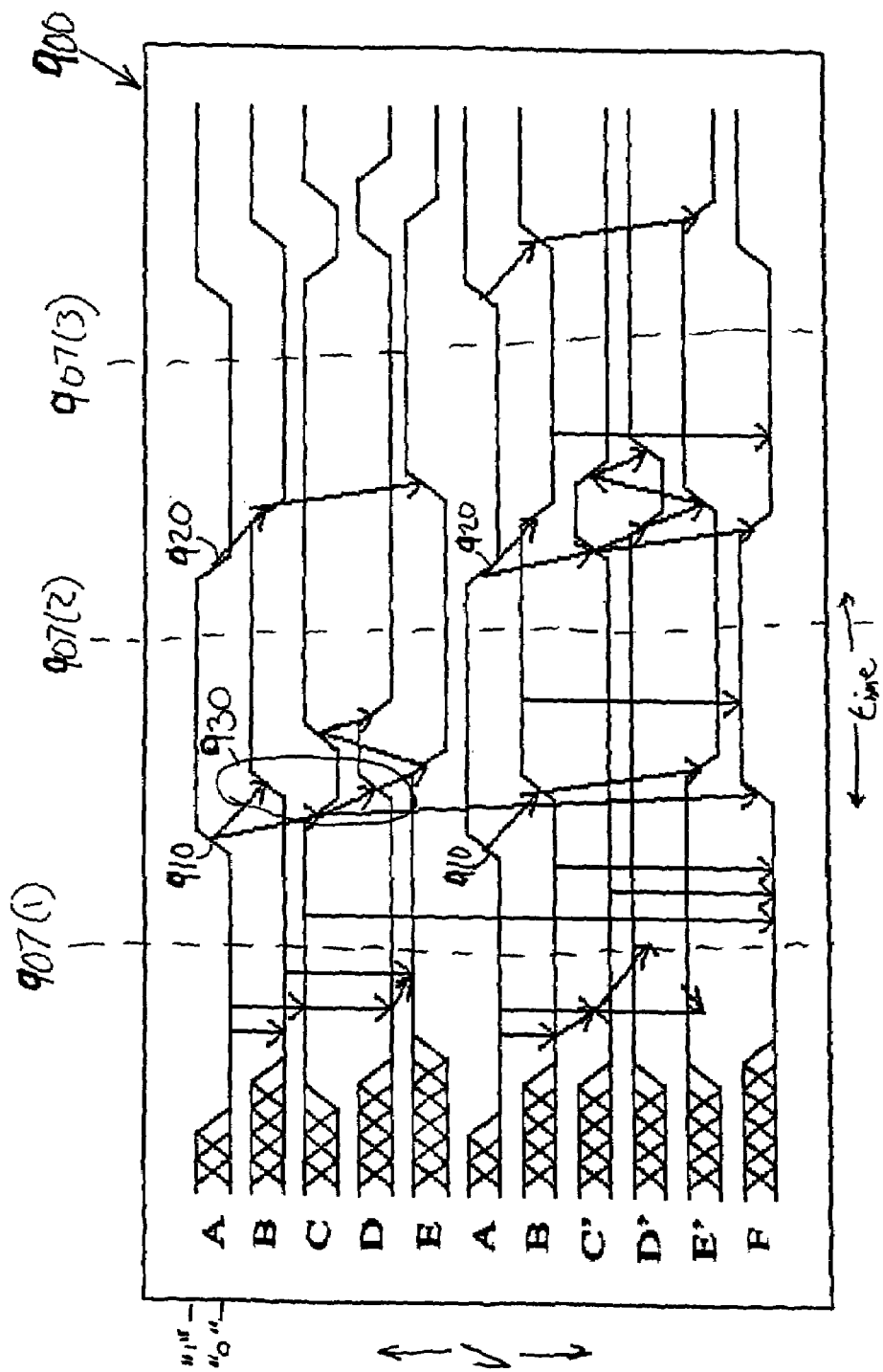
FIG. 9a is a timing diagram which illustrates signals associated with operation of the buffer in FIG. 2.

FIG. 9a illustrates a timing diagram 900 for signals associated with the buffer in FIG. 2. Timing diagram 900 illustrates nine waveforms "A"–"F" and "B'"–"E'", with the vertical axis representing voltage and the horizontal axis representing time. Each waveform represents the signal which is present in the buffer at points "A"–"F" and "B'"–"E'" as illustrated in FIG. 2. More specifically, "A" is the input 112; "F" is the output 117; "B" is the reset signal from the reset generator 130; "C" and "C'" are the pulses out of the pulse generators 120, 140; "D" and "D'" are the outputs from the small inverters 210, 250 in the pulse loop generators 122, 145; and "E" and "E'" are the second inputs 137, 157 to the pulse generators 120, 150.

Figure 9B:
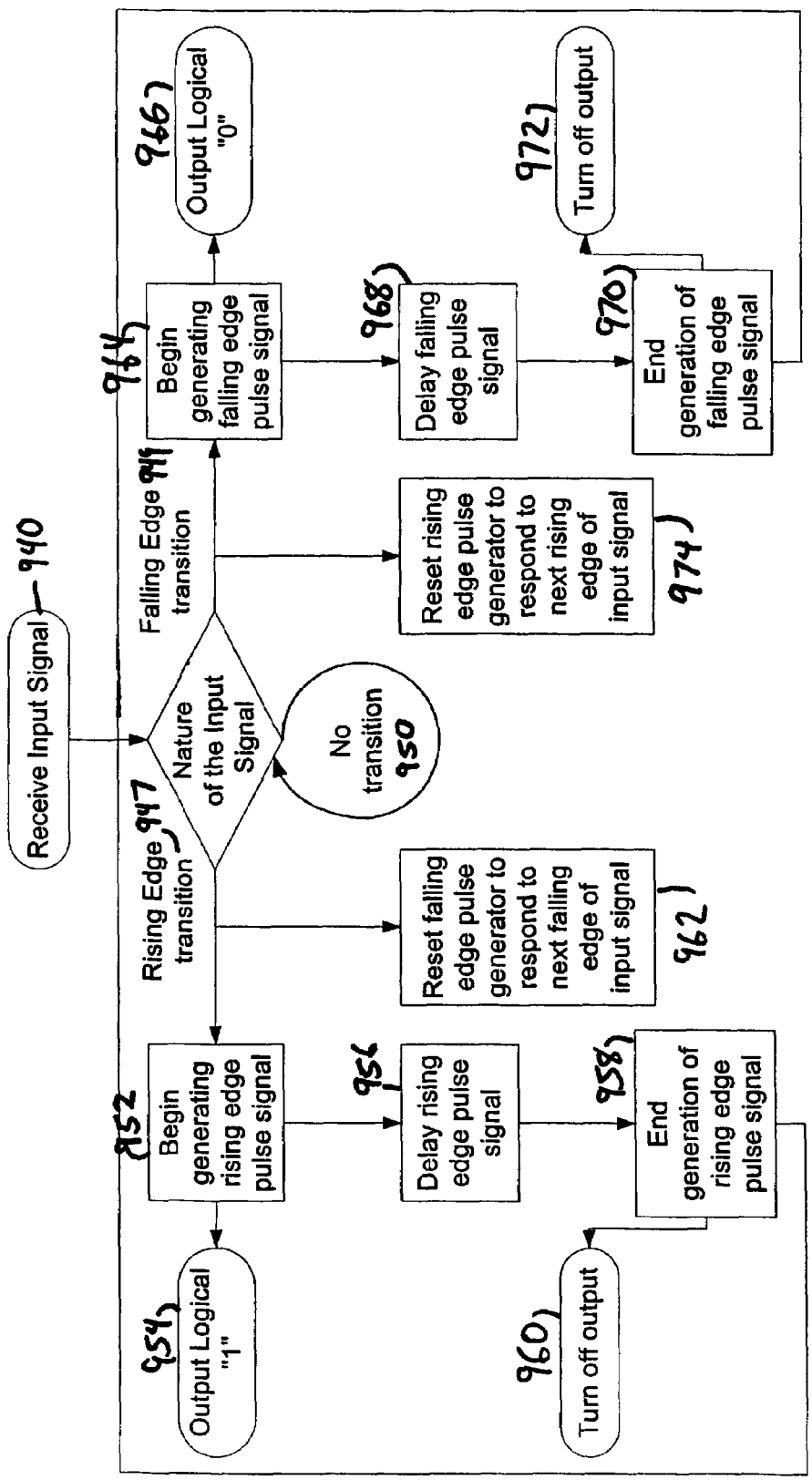
FIG. 9b is a process flow diagram which illustrates operational events associated with the buffer in FIG. 2.

FIG. 9b illustrates a process flow associated with the operation of the buffer 200 and will now be discussed concurrently with FIG. 9a. There are three points in time 907(1), (2), (3) illustrated in the timing diagram 900 which represent the steady state of the buffer. The steady state occurs when all internal transitions have ceased, the pulses have stopped, and the output 117 is held by the buffer 285. At time 907(1), the output of the buffer is a logical "0" as shown in signal "F". This corresponds to the input signal "A" which is also a logical "0". The reset signal "B" also reflects the input signal "A" and triggers rising-edge pulse reset 125 to assert a logical "1" at the second input "E" of the NAND gate 205. This readies the NAND gate 205 to respond to a rising edge transition in the input "A". Additionally, "C" is a logical "1" which indicates that the rising-edge pulse is not active. The rising-edge pulse is active-low, since it is fed to the PFET 275, which is also active-low. Similarly "C'" is at logical "0" which indicates that the active-high falling-edge pulse is not active. "D" inverts "C" and is thus a logical "0" which has turned off NFET 215. Likewise "D'" inverts "C'" and is a logical "1" which has turned off PFET 255. Notice that the second input "E'" to the NOR 245 is held high as well, which effectively turns off the NOR 245. "E'" is held high by the falling-edge loop keeper circuit 155. Also note that both "B" and "D'" have turned off their respective FETs 255, and 270.

A rising edge transition 910 in "A" triggers 947 the activation of the first circuit. As noted above, the first circuit reacts to a rising edge at the input 112. The transition 910 causes the NAND 205 to generate 952 a logical "0" at "C". "C" then drives 954 "F" high since the PFET 275 is active and pulls "F" up. The pulse passes 956 through small inverter 210 to become a logical "1" and switches on NFET 215.

The second input "E" to NAND gate 205 follows the transition in "D" and goes low. "E" is delayed by the latency of the NFET 215. Likewise, "E'" goes low since reset generator 130 has set "B" high which switches NFET 270 to drive E' to logical "0". This resets 962 the NOR gate 245 for a subsequent falling edge transition 920. Once "E" goes low, the NAND gate 205 shuts off the pulse by driving "C" high again. Consider that the delays associated with inverter 210 and NFET 215 help determine the pulse width of "C". By the time "C" is driven high, the signal at "B" propagates through buffer 285 to maintain the output "F" at the same as the input "A". This allows the PFET 275 to turn off 960 in response to "C" going high without causing a tri-state condition on the output "F". If the buffer 285 is too slow, once the PFET 275 switches off 960, the buffer may assert a logical "0" as a holdover from the previous falling edge operation until the new input propagates through. This would cause the output "F" to transition incorrectly.

The change in "C" also propagates through the inverter 210 and drives "D" low, which in turn shuts off the NFET 215. However, "E" remains low since the rising-edge loop keeper circuit 135 maintains the logical "0". "E'" must continue to be driven by falling-edge pulse reset 150. At this point in the operation, the buffer has reached the second steady state time 907(2), which lasts until "A" transitions low 949 at falling edge transition 920. It should be recognized from the above description how the second circuit is triggered 949 by a falling edge, begins generating the falling-edge pulse signal 964, causes "F" to output low 966, delays 968 the falling-edge pulse signal through the falling-edge loop generator 145, ends 970 the generation of the falling-edge pulse signal, turns off 972 the output at the NFET 280, and resets 974 the rising-edge pulse generator.

Note that the structure of the keeper circuit 135 only maintains a logical "0" at "E" and that it shuts off completely when the pulse reset 125 drives "E" high. Likewise, the falling-edge loop keeper circuit 155 only maintains "E'" at a logical "1" and shuts off when the falling-edge pulse reset 150 sets "E'" to a logical "0". In an alternate embodiment, both keeper circuits 135, 155 may be constructed by substituting their lone FETs 225, 265 for a small inverter. The substitution of the FET for an inverter will allow the keeper circuit to maintain either a logical "1" or a logical "0" and may require less delay from a transition in "A" to "B". However, such a substitution also increases the power and size costs of the buffer.

Figure 3:
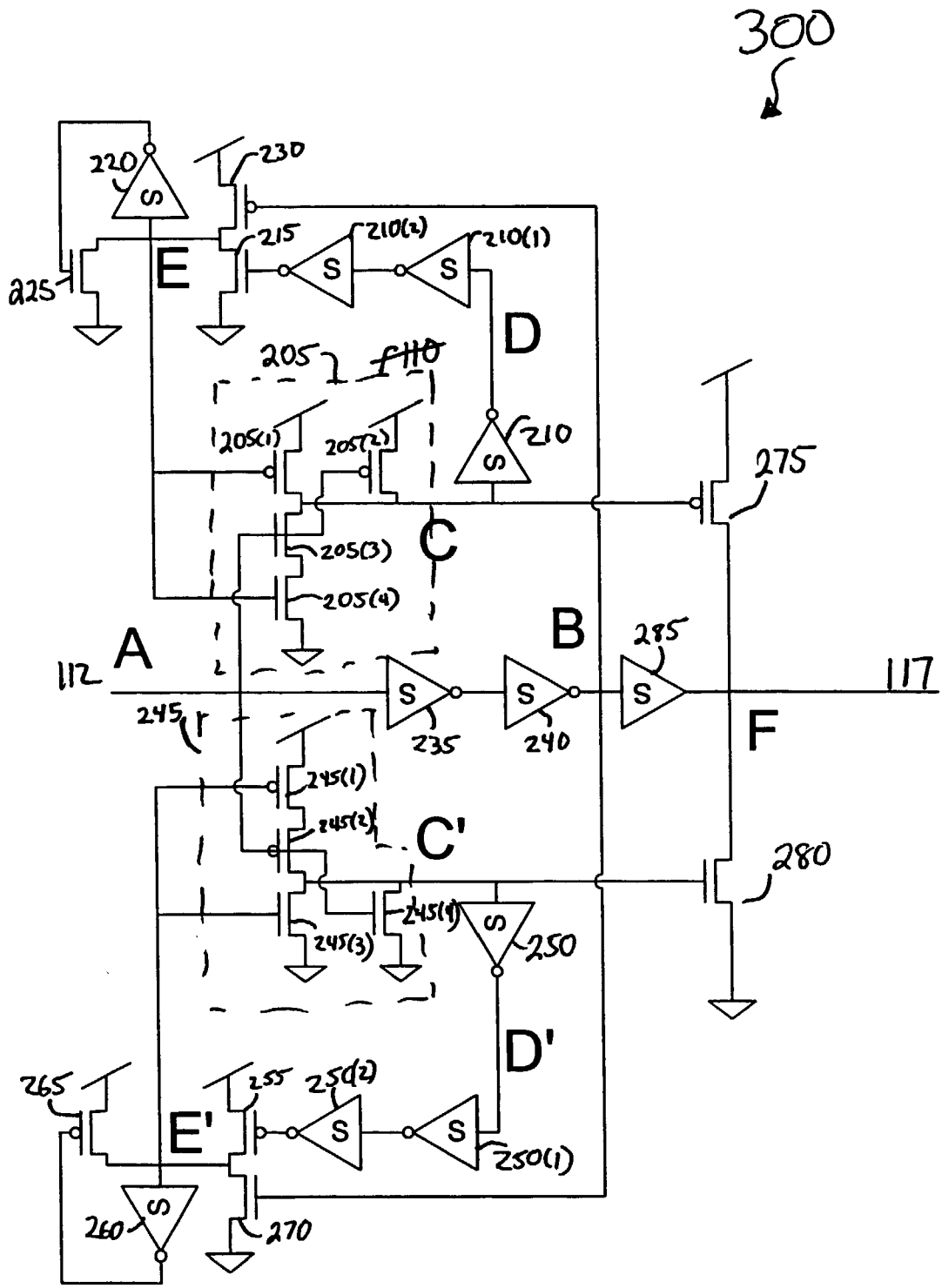
FIG. 3 is a schematic for a level-in-level-out buffer according to the present invention.

FIG. 3 illustrates a schematic for a level-in-level-out buffer 300 according to the present invention. The buffer 300 provides additional transistor detail for the buffer 200 illustrated in FIG. 2. The NAND gate 205 and the NOR gate 245 are represented as a collection of FETs. More specifically, NAND gate 205 comprises a first NFET 205(3) whose gate is connected to input 112. The drain is connected to the source of a second NFET 205(4) and the source is connected to the drain of a first PFET 205(1). The source of NFET 205(3) also provides the output pulse from the NAND gate 205. Second NFET 205(4) receives "E" from the loop keeper 135, pulse reset 125, and pulse loop generator 122 at its gate. The drain is grounded. First PFET 205(1) has its gate connected to "E" and its source is connected to a logical "1". Finally, NAND gate 205 also includes a second PFET 205(2). The source of PFET 205(2) is connected to a logical "1", the drain is connected to the source of NFET 205(3), and its gate is connected to the input 112. Together, the four FETs 205(1)-(4) cooperate in a conventional manner to provide the NAND logic function. Because of the sequence of operation, PFET 205(2) does not cause "C" to switch high. Instead, "C" is switched high by PFET 205(1). PFET 205(2) provides noise immunity for input 112. The ratio of PFET 205(2) to the combination of NFETs 205(3), (4) sets the switching threshold and therefore noise immunity of NAND 205. In another embodiment, PFET 205(2) may be omitted. This improves delay from "A" to "C" but reduces the noise immunity of input 112.

Similarly, NOR gate 245 comprises a first PFET 245(2) whose gate is connected to input 112. The source is connected to the drain of a second PFET 245(1) and the drain is connected to the source of a first NFET 245(3). The drain of PFET 245(2) also provides the output pulse from the NOR gate 245. Second PFET 245(1) receives "E'" from the loop keeper 155, pulse reset 150, and pulse loop generator 145 at its gate. The source is connected to a supply that is representative of a logical "1". First NFET 245(3) has its gate connected to "E'" and its drain is connected to ground. Finally, NOR gate 245 also includes a second NFET 205(4). The drain of PFET 205(2) is grounded, the source is connected to the drain of PFET 245(1) and its gate is connected to the input 112. Together the four FETs 245(1)–(4) cooperate in a conventional manner to provide the NOR logic function. Because of the sequence of operation, NFET 245(4) does not cause "C" to switch high. Instead, this is done by NFET 245(3). NFET 245(4) provides noise immunity for input 112. The ratio of NFET 245(4) to the combination of PFETs 245(1), (2) sets the switching threshold and therefore noise immunity of NOR 245. In another embodiment, NFET 245(4) may be omitted. This improves delay from "A" to "C'" but reduces the noise immunity of input 112.

Buffer 300 also includes two additional small inverters 210(1), 210(2) in the rising-edge pulse loop path. They are coupled in series with one another and are inserted inline between the output of inverter 210 and the gate of NFET 215. The two inverters 210(1), (2) act as a small gain amplifier and delay device. Thus "D" is further delayed before it reaches the NFET 215. NFET 215 will have a faster transition due to the improved transition time of inverter 210(2), but the overall effect is to delay the transition time of NFET 215. This increases the pulse width applied to the output 117 by PFET 275. Likewise, two additional inverters 250(1) and 250(2) have similarly been inserted into the falling-edge pulse loop line between inverter 250 and PFET 255. The increased pulse width in the loops allows robust circuit operation for slower transition times of input 112 and for larger process variation in the parameters of the individual transistors.

Buffer 300 advantageously minimizes the number of devices present in the critical path for either the first circuit or the second circuit. In addition, buffer 300 provides that every device in the critical path is "large" and fast, while the remaining devices are smaller and consequently slower. In one embodiment, all transistors are assumed to be of a minimum channel length for best performance. "Large" and "small" refer to the channel width of a transistor. The current capacity of a transistor is proportional to its width. In this context, "large" means devices with a channel width that provides an impedance similar to the impedance driving input 112 or the impedance of the load on output 117. This impedance match provides a minimum delay on the critical path In contrast, "small" means widths significantly smaller than the critical path transistors. The parasitic capacitive load on the critical path created by the "small" transistors therefore has only a small effect on critical path delay. By providing large devices in the critical path, the buffer 300 can respond quicker to the transitions in the data at input 112.

The critical path for the rising edge is as follows. The path begins with input 112, and propagates across NFET 205(3). The only remaining device on the critical path is the PFET 275 at the output stage which then drives output 117 high. As discussed above with reference to FIG. 9a, both NFET 205(3) as part of the NAND gate 205, and PFET 275 are switched on only for the beginning portion of a transition period. Thus each is large in order to quickly respond to the transition, but then they are turned off to conserve power and prevent noise and delay due to crowbar current and parasitic loads.

A similar critical path exists for the second circuit, where the input 112 propagates through PFET 245(2) and NFET 280. The remainder of the devices in the first and second circuits are "small" and do not require fast reaction time, or large amounts of power. Thus, by using large devices in the critical paths, and small devices in the remaining circuitry, the buffer 300 retains the ability to react very quickly to a rising or falling edge while also maintaining economies of power consumption and size.

In addition to the large critical path elements, the NFET 205(4) and PFET 245(1) are also designed to be large. As noted in FIG. 2, the NAND gate 205 is designed to be N-skewed, or much more responsive to a rising edge, than a falling edge. NFET 205(4) receives a logical "1" from the pulse reset 125 during the activity period of the second circuit. By making NFET 205(4) as large as NFET 205(3), NAND gate 205 will have a fast response to a rising transition on the gate of NFET 205(3). For similar reasons, PFET 245(1) in NOR gate 245 is also designed to be large to skew the NOR gate for fast response to a falling transition on the gate of PFET 245(2). As noted earlier, PFET 205(2) and NFET 245(4) are small transistors that provide noise immunity and are not part of critical path switching.

Figure 4A:
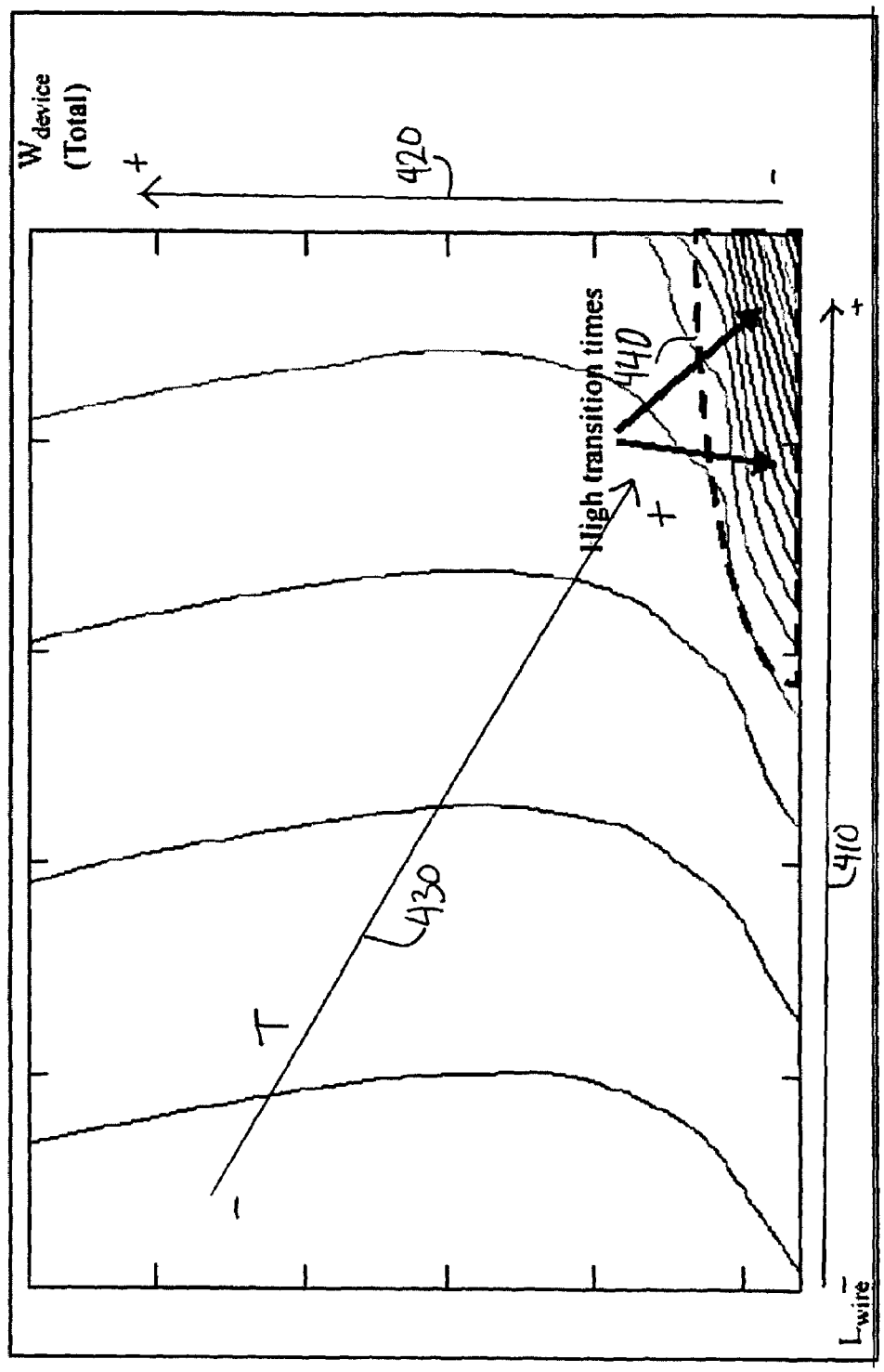
FIG. 4a is a graph which illustrates transition times plotted against wire length and device width.

FIG. 4a illustrates a graph showing the relationship between the total width of the device ($W_{device}$ on the Y-axis), the total length of the wire ($L_{wire}$ on the X-axis) and a transition time surface through the buffer (represented by isoclines). The length of the wire increases in the direction of a first arrow 410. The width of the device increases in the direction of a second arrow 420. In response to the changes in device width and wire length, the time surface represented by the isoclines increases in the direction of a third arrow 430. As can be seen from the graph, as wire length increases, the latency also generally increases. If the device width is too small for a given wire length, the transition times increase dramatically. This area of the graph is highlighted by the dotted line 440.

This effect occurs whenever the buffer is too heavily loaded or the data input signal transition times exceed the buffer's pulse widths. When the buffer is too heavily loaded (i.e. the wire is too long and the buffer is too small), the transition times for the buffer increase. If the transition times increase too much, then the FETs in the output stage may switch off prematurely leaving the output in a tri-state mode until the input signal propagates through to the output stage via the small buffer 285 (when present). As such, the internal pulse widths of the buffer exceed the longest expected input transition time. There a two failure modes if this is not done. For embodiments with a holding buffer 285 as in FIG. 3, there is only a frequency failure. The buffer will eventually attain the correct output state, but at a much longer delay. This forces a lower-than-expected frequency of operation. For embodiments using an output keeper 285 as in FIGS. 5a, 6a, and 7a, (discussed in more detail below) there is a functional failure. The buffer will eventually revert to its previous output state.

The buffer most efficiently takes advantages of its structure when used as a large device. The power and speed advantages taper off as the critical path elements are formed from smaller transistors. Even though the non-critical path elements are intended to be relatively small, they must still be larger than the minimum device size set by the process. As the entire device becomes small, the large devices cease to be large relative to the small devices. The parasitic effects of the small devices become noticeable, and the delay of the overall circuit degrades.

Since the buffer is most advantageously used as a large device, it is most suited for long-wire communication or large amplification tasks. The buffer 200 of the present invention may be directly substituted for conventional buffers in long wires. Significant power and speed savings arise from replacing a conventional double-inverter buffer with the LILO buffer 200 of the same overall size. In this situation it is common to gain a 13% reduction in latency and a 5% increase in power efficiency. Alternatively, designing the integrated circuit and long-wire route to take full advantage of the LILO buffer's 200 speed would realize a 23% speed increase over conventional buffers, but would required 15% more power.

Figure 4B:
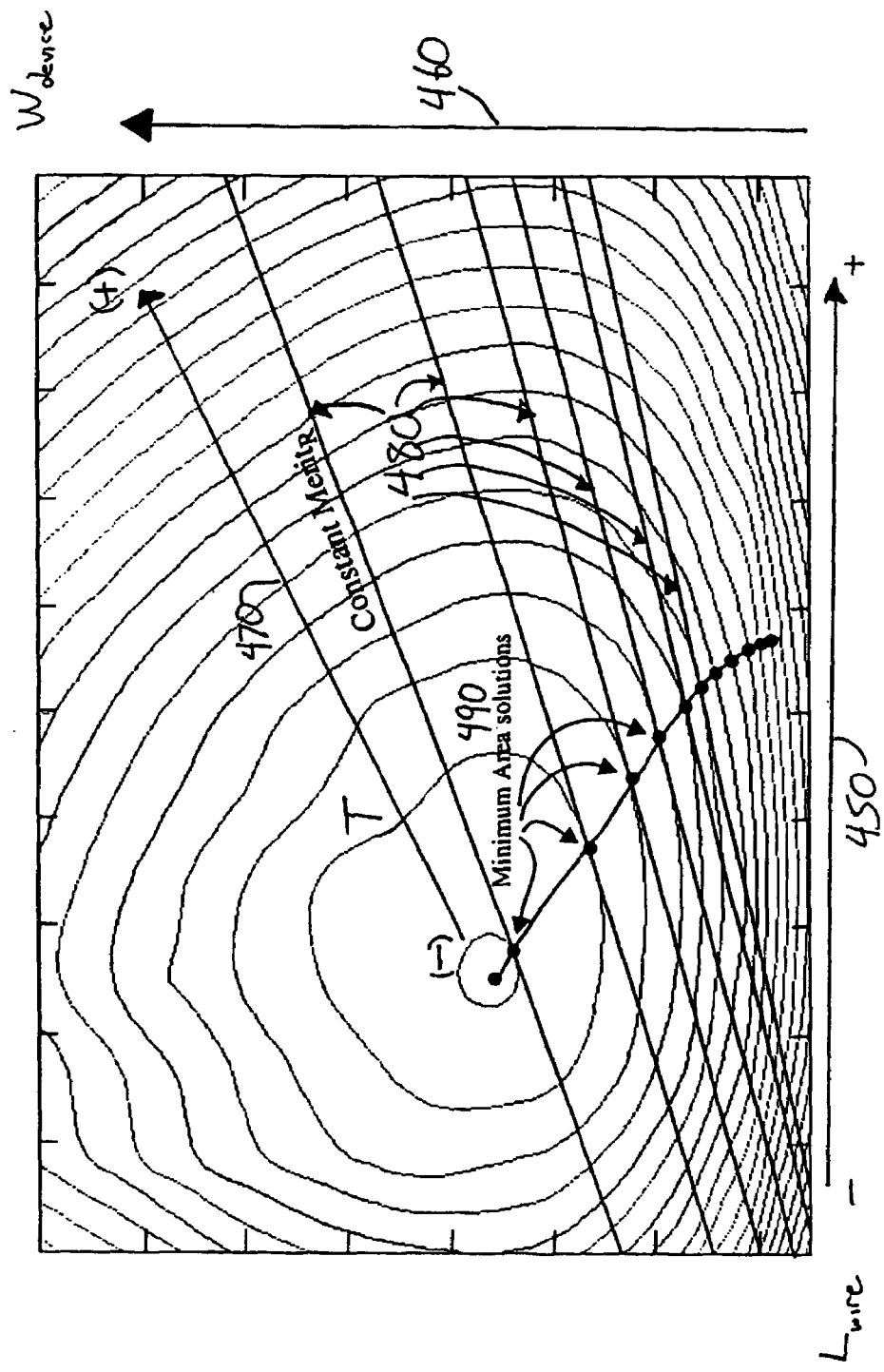
FIG. 4b is a graph which illustrates latency times plotted against wire length and device width.

There are several trade-offs between wire length and device width which may be used when determining the optimum size and spacing of the LILO buffer 200 to take full advantage of the operational characteristics of the buffer 200. The FIG. 4b illustrates a preferred method for determining the optimal sizing for the LILO buffer. FIG. 4b illustrates a graph with wire length increasing along a first arrow 450, and device width increasing along a second arrow 460. The isoclines illustrated in FIG. 4b represent a surface of latency times. The latency time is smallest near the center of the isoclines and radiates outward increasing along a third arrow 470. In addition to the isoclines, a plurality of constant $Merit_R$ lines 480, or area lines, are plotted according to the equation:

$$Merit_R = \frac{W_{device}}{L_{wire}}$$

The optimal point for any given latency isocline is found by the "lowest" constant $Merit_R$ line which lies tangent to the isocline. The tangent point represents the optimum tradeoff between wire length and device width. By utilizing the minimum area criteria in which the total area, or $Merit_R$, is minimized for a given latency isocline, then the buffer 200 may be optimized for smallest size at a given speed, gaining approximately 23% in speed over conventional double-inverter buffers.

The complement reset topology and pulse loop of the present invention may also be used to form other types of buffers. FIGS. 5a and 5b illustrate a schematic and timing diagram 501 for a pulse-in-level-out (PILO) buffer 500 according to the present invention. FIGS. 5a and 5b illustrate the PILO buffer 500 in a manner similar to FIGS. 2 and 9a, including the use and identity of the signals "A"–"F", and "C'"–"E'". Two additional signals, "A'" and "B'" are also illustrated. "A'" corresponds to the negative input provided by a two wire pulse communication system. In pulse communication systems a single data signal input 112 is converted into two pulse signals 112(1) and 112(2). Pulse signal 112(1) pulses high when a rising edge is detected in data input 112. Pulse signal 112(2) pulses low when the data input 112 has a falling edge. The leading edges of pulses 112(1) and 112(2) carry the information of input 112 and are used. The trailing edges carry no information and are not used by the system. Pulse communication schemes are useful in ensuring that each information-bearing transition is as fast as possible across a long wire by maintaining separate signals for each transition. This allows each communication line to use skewed buffers for lower critical edge latency. Buffer 500 receives the pulse inputs "A" and "A'" and output a level output "F". In effect, buffer 500 both buffers and boosts the data signal, and also converts the signal from a pulse to a level communication system by combining "A" and "A'" into a single output "F".

The pulse stage 510 is similar in operation to the pulse stage 110 illustrated in FIG. 2 with the following differences. First, the reset signal "B" is now generated as two separate signals "B" and "B'". This is required since "A" and its complement "A'" are provided separately, and may not be orthogonal. This requires modification to the reset generator 130. The reset generator includes two additional inverters 235' and 240'. The additional inverters are wired in series and the input of inverter 235' receives "A'" from input 112(2) and the output of 240' is "B'" which acts as the reset signal for the rising-edge pulse reset 125, and specifically PFET 230. Inverter 235 receives input from "A" from input 112(1) but now the output from inverter 240 acts as the reset signal "B" only for NFET 270 in the falling-edge pulse reset 150.

The reset strategy is the same as in the above-described buffer 200. Each circuit in the pulse stage 510 is reset during the operation of the complement circuit. However, now that "A" and "A'" each are in pulse form, the loop keeper circuits 135 and 155 as described above, must be formed from a pair of inverters, instead of using a single transistor topology as described above. Specifically, the rising-edge loop keeper circuit is formed by inverter 220, and NFET 225 has been replaced by an inverter 525. This allows the circuit keeper 135 to retain either a logical "1" or a logical "0" and does not require the reset signal on PFET 230 to remain active. Likewise, PFET 265 has been replaced by an inverter 565. Since "A" and "A'" are pulsed, the reset signals "B" and "B'" will also be pulsed. This can be seen in the timing diagram 501 at 580 and 590.

To prevent a tri-state output in a buffer employing pulse stage 510, the buffer 285 in the output stage 115 is replaced with two inverters 285(1) and 285(2). Since there is no longer a single input 112 for the buffer 285 to draw its signal from, the embodiment 500 instead utilizes a keeper circuit on the output 117. Specifically the inverters 285(1) and 285(2) are arranged so that the input of inverter 285(2) is connected to the output 117 and the output of inverter 285(2) is connected to the input of inverter 285(1). The output of inverter 285(1) is connected back to the output 117. Thus, the two inverters 285(1) and 285(2) serve to keep the last value asserted by the FETs 275 and 280. The inverters 285(1), 285(2) are sufficiently weak so as not to override the FET 275, 280 output. In another embodiment buffer 285 could be driven by a set-reset latch which is in turn driven by pulse inputs 112(1) and 112(2).

Figures 6A, 6B:
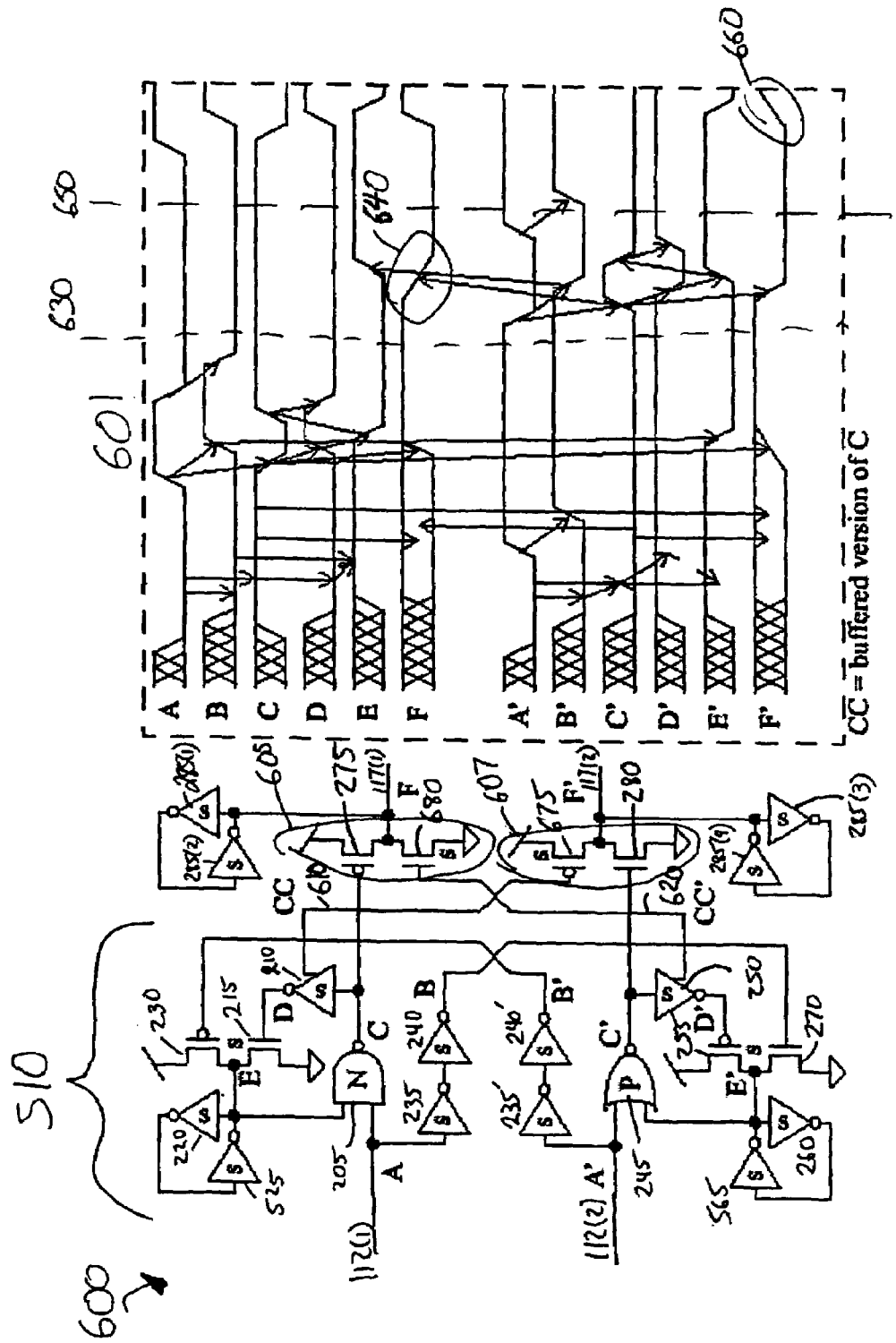
FIGS. 6a and 6b are, respectively, schematic and timing diagrams for a pulse-in-pulse-out buffer according to the present invention.

FIGS. 6a and 6b illustrate a schematic and timing diagram 601 for a pulse-in-pulse-out (PIPO) buffer 600 according to the present invention. FIGS. 6a and 6b illustrate the PIPO buffer 600 in a similar manner as FIGS. 5a, and 5b, including the use and identity of signals A–F and A'–E'. Similar to PILO buffer 500, PIPO buffer 600 receives a positive and negative pulse signals "A", "A'", but instead of combining the input signals "A" and "A'" into a single signal "F", buffer 600 retains the pulse formatting and outputs two signals, "F" and "F'" corresponding to the positive and negative pulse inputs "A" and "A'" respectively.

PIPO buffer 600 employs the same pulse stage 510 as the PILO buffer 500 illustrated in FIG. 5a above. The output stage 115, however has been modified to generate the pulse outputs "F" and "F'". Since there are two separate outputs, "F", "F'", the output stage 115 is split into two transistor pairs 605, 607. Each transistor pair operates similarly to the output stage 115 described with respect to the LILO buffer 200 in FIG. 2. One major difference is that transistor pair 605 contains the large PFET 275, while transistor pair 607 includes the large NFET 280, which were previously coupled together to output the level output "F".

Large PFET 275 still receives the pulse from the first circuit's NAND gate 205 at its gate, and is coupled to a supply representing a logical "1" at its source. PFET 275 has its drain coupled to the source of a small NFET 680. The junction between PFET 275 and NFET 680 also serves as the output 117(1), i.e., the positive pulse output "F". This output is also coupled to a keeper circuit formed from a first inverter 285(1) and a second inverter 285(2). Inverter 285(1) receives input from output 117(1) and supplies the inverted signal to inverter 285(2), which in turn supplies the double-inverted signal back onto output 117(1), thus holding the output when the transistor pair 605 enters a tri-state mode. One example of when the transistor pair 605 enters tri-state mode is marked by line 630 on timing diagram 601.

Returning to the transistor pair 605, NFET 680 has its drain connected to ground, and its gate is coupled to a line 620. Line 620 is coupled to inverter 255, and receives a pulse signal "CC'" corresponding to a buffered version of "C'". Pulse signal "CC'" shuts the positive pulse output "F" off. However, in order to conserve energy, and relying on the fact that in a pulse communication system the falling edge of a positive pulse is typically not used, NFET 680 may be made very small. By making NFET 680 small, less power is consumed, and the falling edge has a larger transition time, as shown at 640 in timing diagram 601. However, as noted above, the system does not use the falling edge of the output "F'" so a slow falling edge 640 is acceptable. Driving NFET 680 directly from "C'" would slow down the critical path. Since NFET 680 is not critical, it is instead driven by "CC'" which is generated from "C'" without adding load to Transistor pair 607 is configured in a similar manner. Large NFET 280 still receives the pulse from the second circuit's NOR gate 245 at its gate, and is grounded at its drain. NEFT 280 has its source coupled to the drain of a small PFET 675. The junction between NFET 280 and PFET 675 also serves as the output 117(2), i.e., the negative pulse output "F'". This output is also coupled to a keeper circuit formed from a first inverter 285(3) and a second inverter 285(4). Inverter 285(3) receives input from output 117(2) and outputs the inverted signal to inverter 285(4), which in turn supplies the double-inverted signal back onto output 117(2), thus holding the output when the transistor pair 607 enters a tri-state mode. One example of when the transistor pair 607 enters tri-state mode is marked by line 650 on timing diagram 601.

Returning to the transistor pair 607, PFET 675 has its source coupled to a supply that is representative of a logical "1", and its gate is coupled to a line 610. Line 610 is coupled to inverter 210, and receives a pulse signal "CC" corresponding to a buffered version of "C". Pulse signal "CC" shuts the negative pulse output "F'" off. However, in order to conserve energy, and relying on the fact that in a pulse communication system the rising edge of a negative pulse is typically not used, PFET 675 may be made very small. By making PFET 675 small, less power is consumed, and the rising edge has a larger transition time, as shown at 660 in timing diagram 601. As noted above, the system does not use the rising edge of the output "F'" and so a slow falling edge 660 is acceptable. Driving PFET 675 directly from "C" would slow down the critical path. Since PFET 675 is not critical, it is instead driven by "CC" which is generated from "C" without adding load to "C".

FIGS. 7a and 7b illustrate a schematic and timing diagram for a level-in-pulse-out (LIPO) buffer 700 according to the present invention. LIPO buffer 700 performs the opposite function of PILO buffer 500. LIPO buffer 700 receives a level input "F" and splits the data into a positive and negative pulse output "F" and "F'" respectively. Buffer 700 comprises a pulse stage arrangement similar to the pulse stage illustrated in FIG. 2. This pulse stage is combined with the output stage 115 illustrated in FIG. 6a. In order to combine these two stages, minor changes have also been made. As discussed with respect to the PILO buffer 500 in FIG. 5a, the rising-edge loop keeper circuit 135 and falling-edge loop keeper circuit 155 have been modified to substitute the respective FETs 225, 265 with a second inverter 525, 565. Such a replacement allows the keeper circuits 135, 155 to hold either a logical "1" or a logical "0" and does not rely on the reset signal "B" remaining active. While this modification is not necessary, it is presented as an alternative to the structure discussed in FIG. 2. The second minor modification to the pulse stage 115 includes the addition of lines 610 and 620 as discussed in FIG. 6a. These lines are included to allow the output stage to produce the separate positive and negative pulse outputs "F" and "F'".

As noted above, the present invention is suitable for applications requiring speed, efficiency, and the ability to handle long-wire distances. Within a microprocessor, this typically equates to signal distribution grids. Since these buffers are both fast and do not require synchronous operation, they may be advantageously used to speed up clock distribution while reducing clock skew in an integrated circuit, or may be used to decrease access times for cache memory (i.e. wires such as L2 or L3 routes.) Additionally, the buffer may advantageously use its large amplification to drive phase lock loop (PLL) outputs, construct off chip drivers (OCD), amplifiers and other large loads.

Figure 8:
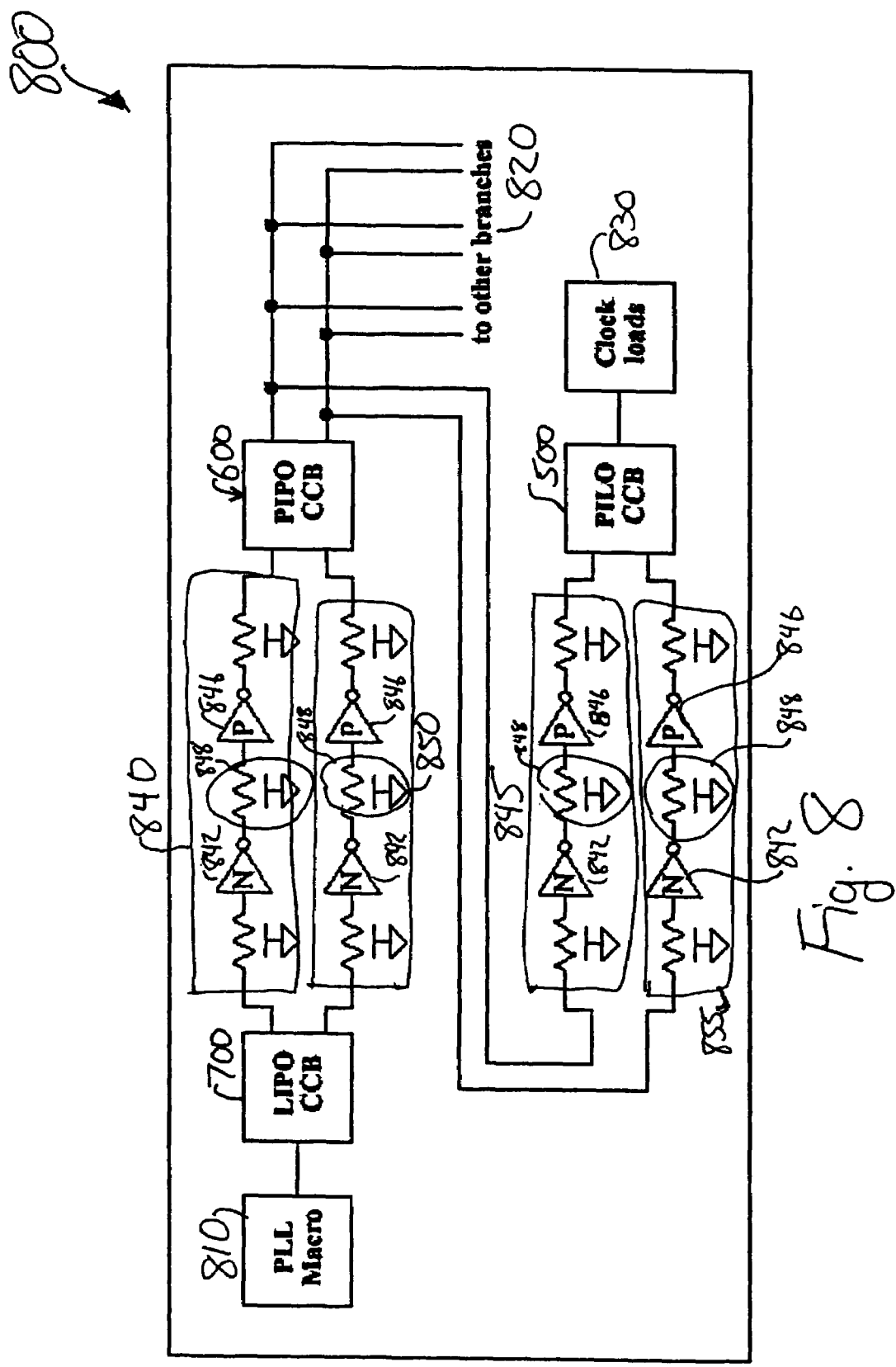
FIG. 8 is a high-level block diagram of an application using buffers according to the present invention.

FIG. 8 illustrates a high-level block diagram of a clock distribution system 800 utilizing various embodiments of the invention. Distribution system 800 provides a system for receiving a PLL clock 810 signal and distributing it across multiple branches 820, ultimately delivering the clock signal to a clock load 830. In a typical clock distribution system, the system must be able to cope with cross-chip long-wire routes as well as with multi-device fan-out which requires substantial amplification. A more detailed discussion of a similar clock distribution system can be found in U.S. patent application Ser. No. 10/040,750 entitled "Low Latency Clock Distribution" filed on Dec. 28, 2001 by Robert P. Masleid, which is hereby incorporated by reference. FIG. 8 also illustrates how the present invention can integrate level and pulse communication into one distribution system. Some stages can be signal with levels, others can signal with pulses. The pulse stages can use buffers of the present invention or skewed inverters as desired or based on size and power constraints.

The clock signal is received from the PLL clock 810 by a LIPO buffer 800. The LIPO buffer 800 outputs a positive and negative pulse signal corresponding to the clock signal. The positive pulse signal is output to a skewed amplifier 840 which comprises alternating skewed inverters. As illustrated, skewed amplifier 840 includes two skewed inverters, one skewed to the rising edge 846, and one skewed to the falling edge 842. The additional resistors and capacitors, e.g. 848, represent the effects of the wiring between the inverters.

The skewed inverter 840 supplies a non-inverted clock signal to a PIPO buffer 600. The PIPO buffer 600 is placed before the distribution grid branches 820 to other clock loads and amplifiers. For each branch, a PIPO buffer 600 supplies a positive pulse signal to a second skewed amplifier 845, which is formed similar to amplifier 840. The second skewed amplifier 845 supplies the positive pulse signal to a PILO buffer 500. In similar fashion, the negative pulse signal from the LIPO buffer 700 passes through a third skewed amplifier 850, through the PIPO buffer 600 and finally through a fourth skewed amplifier 855 to PILO buffer 500. PILO buffer 500 receives the positive and negative pulses from skewed amplifiers 845 and 855 and boosts and combines the signals into a level signal, which is supplied to the clock loads 830.

Therefore, the complement reset buffer provides faster transitions and lower latency in repeating data while also conserving power when compared to a conventional buffer used on long lines. The complement reset buffer advantageously uses a pulse loop generated from the output of each of its pulse generators to end the associated pulse output. This allows quick response times while ensuring that slow transitions will be processed by the buffer. Additionally, each pulse generator is reset by the complement of the data edge that pulse generator is concerned with. By using the data complement to reset each circuit, the buffer may operate without external control. The buffer may be formed as a LILO, PILO, LIPO, or PIPO as required by the surrounding circuit requirements. Finally, one buffer or several buffers in various configurations may be utilized to create a data transmission system which utilizes level signals in some stages of the system, and utilizes pulse signals in other stages.

What is claimed is:

1. A buffer circuit for receiving an input signal and for providing an output signal, the buffer comprising:
a first pulse generator coupled to receive the input signal and configured to generate a first pulse responsive to a first transition edge of the input signal;
a first pulse loop generator coupled to receive the first pulse from the first pulse generator and configured to generate a first pulse loop signal to deactivate the first pulse generator responsive to the first pulse;
a second pulse generator coupled to receive the input signal and configured to generate a second pulse responsive to a second transition edge of the input signal;
a second pulse loop generator coupled to receive the second pulse from the second pulse generator and configured to generate a second pulse loop signal to deactivate the second pulse generator responsive to the second pulse;
an output stage coupled to receive the first and second pulses and configured to produce an output of first logic value for the duration of the first pulse, and of second logic value for the duration of the second pulse as the output signal from the buffer circuit;
a first loop keeper circuit coupled to intercept the first pulse loop signal between the first pulse loop generator and the first pulse generator and configured to deactivate the first pulse generator responsive to receiving the first pulse loop signal, thereby blocking subsequent first pulse loop signals from reaching the first pulse generator;
a reset generator coupled to receive the input signal and to output a first reset signal responsive to a falling edge of the input signal; and
a first pulse reset coupled to receive the first reset signal from the reset generator and responsive to the first reset signal configured to deactivate the first loop keeper circuit and to reset the first pulse generator to respond to a subsequent rising edge in the input signal.

2. The buffer circuit of claim 1, wherein the buffer receives the input signal from a first a data distribution circuit and provides the output signal to a second data distribution circuit.

3. The buffer circuit of claim 1, further comprising:
a second loop keeper circuit coupled to receive the second pulse loop signal from second pulse loop generator and configured to deactivate the second pulse generator responsive to receiving the second pulse loop signal, thereby blocking subsequent second pulse loop signals from reaching the second pulse generator;
the reset generator coupled to receive the input signal and to output a second reset signal responsive to a rising edge of the input signal; and
a second pulse reset coupled to receive the second reset signal from the reset generator and responsive to the second reset signal, configured to deactivate the second loop keeper circuit and to reset the second pulse generator to respond to a subsequent falling edge in the input signal.

4. The buffer circuit of claim 1, wherein the output stage comprises a keeper circuit configured to hold the output signal constant between first and second pulses.

5. The buffer circuit of claim 1, wherein the first and second pulse generators and the output stage are configured to be large devices.

6. The buffer circuit of claim 1, wherein the width of the first pulse is determined by the amount of delay between the first pulse generator producing the first pulse and the first pulse loop generator producing the first pulse loop signal.

7. The buffer circuit of claim 1, wherein the width of the second pulse is determined by the amount of delay between the second pulse generator producing the second pulse and the second pulse loop generator producing the second pulse loop signal.

8. The buffer circuit of claim 1, wherein the first and second pulse generators are configured to receive a level signal from the input signal, and the output stage is configured to generate a level signal as the output signal.

9. The buffer circuit of claim 1, wherein:
the input signal comprises a positive pulse input and a negative pulse input;
the first pulse generator is configured to receive the positive pulse input;
the second pulse generator is configured to receive the negative pulse input; and
the output stage is configured to generate a level signal as the output signal.

10. The buffer circuit of claim 1, wherein:
the input signal comprises a positive pulse input and a negative pulse input;
the first pulse generator is configured to receive the positive pulse input,
the second pulse generator is configured to receive the negative pulse input; and
the output stage is configured to generate a positive pulse output responsive to the positive pulse input and to generate a negative pulse output responsive to the negative pulse input.

11. The buffer circuit of claim 1, wherein:
the first and second pulse generators are configured to receive a level signal from the input signal; and
the output stage is configured to generate a positive pulse output responsive to a rising edge in the input signal and to generate a negative pulse output responsive to a falling edge in the input signal.

12. A buffer circuit for receiving an input signal and for providing an output signal, the buffer circuit comprising:
a rising edge pulse generator coupled to receive the input signal and configured to generate a rising edge pulse responsive to a rising edge in the input signal, to receive a delayed version of the rising edge pulse and to terminate the rising edge pulse responsive to the delayed rising edge pulse;
a falling edge pulse generator coupled to receive the input signal and configured to generate a falling edge pulse responsive to a falling edge in the input signal, to receive a delayed version of the falling edge pulse and to terminate the falling edge pulse responsive to the delayed falling edge pulse:
an output stage coupled to receive the rising edge pulse and the falling edge pulse and configured to output a first logic value for the duration of the first pulse and of second logic value for the duration of the second pulse as the output signal from the buffer circuit; and
a reset generator coupled to receive the input signal and configured to generate a rising edge reset signal to enable the rising edge pulse generator responsive to a falling edge in the input signal, and configured to generate a falling edge reset signal to enable the falling edge pulse generator responsive to a rising edge in the input signal.

13. The buffer circuit of claim 12, wherein the output stage comprises a keeper circuit configured to hold the output signal constant between the rising edge pulse and falling edge pulse.

14. The buffer circuit of claim 12, wherein the rising edge pulse generator, the falling edge pulse generator, and the output stage are configured to be large devices.

15. The buffer circuit of claim 12, wherein the rising edge pulse generator and the falling edge pulse generator are configured to receive a level signal from the input signal, and the output stage is configured to generate a level signal as the output signal.

16. The buffer circuit of claim 12, wherein:
the input signal comprises a positive pulse input and a negative pulse input;
the rising edge pulse generator is configured to receive the positive pulse input;
the falling edge pulse generator is configured to receive the negative pulse input; and
the output stage is configured to generate a level signal as the output signal.

17. The buffer circuit of claim 12, wherein:
the input signal comprises a positive pulse input and a negative pulse input;
the rising edge pulse generator is configured to receive the positive pulse input,
the falling edge pulse generator is configured to receive the negative pulse input; and
the output stage is configured to generate a positive pulse output responsive to the positive pulse input and to generate a negative pulse output responsive to the negative pulse input.

18. The buffer circuit of claim 12, wherein:
the rising edge pulse generator and the falling edge pulse generator are configured to receive a level signal from the input signal; and
the output stage is configured to generate a positive pulse output responsive to a rising edge in the input signal and to generate a negative pulse output responsive to a falling edge in the input signal.

19. The buffer circuit of claim 12, wherein the buffer receives the input signal from a first a data distribution circuit and provides the output signal to a second data distribution circuit.

20. The buffer of claim 12, further comprising:
a rising edge pulse loop generator coupled to receive the rising edge pulse from the rising edge pulse generator and configured to produce a delayed rising edge pulse;
a rising edge loop keeper circuit coupled to receive the delayed rising edge pulse and configured to block the rising edge pulse and to disable the rising edge pulse generator; and
a rising edge pulse reset coupled to receive the rising edge reset signal and configured to disable the rising edge loop keeper circuit and to re-enable the rising edge pulse generator responsive to the rising edge reset signal.

21. The buffer circuit of claim 20, wherein the width of the rising edge pulse is determined by the amount of delay between the rising edge pulse generator producing the rising edge pulse and the rising edge pulse loop generator producing the delayed rising edge pulse signal.

22. The buffer of claim 12, further comprising:
a falling edge pulse loop generator coupled to receive the falling edge pulse from the falling edge pulse generator and configured to produce a delayed falling edge pulse; and
a falling edge loop keeper circuit coupled to receive the delayed falling edge pulse and configured to block the falling edge pulse and to disable the falling edge pulse generator; and
a falling edge pulse reset coupled to receive the falling edge reset signal and configured to disable the falling edge loop keeper circuit and to re-enable the falling edge pulse generator responsive to the falling edge reset signal.

23. The buffer circuit of claim 22, wherein the width of the second pulse is determined by the amount of delay between the falling edge pulse generator producing the falling edge pulse and the falling edge pulse loop generator producing the delayed falling edge pulse signal.

24. A buffer circuit comprising:
an input means for receiving an input signal:
a pulse generation means for turning on a pulse signal responsive to a transition in the input signal;
an output means for outputting a signal responsive to the pulse signal;
a delaying means for delaying the pulse signal to generate a delayed pulse signal;
a looping means for turning off the pulse generation means responsive to the delayed pulse signal; and
a reset means for resetting the buffer circuit to enable it to respond to a subsequent transition in the input signal, the reset means acting responsive to a complement transition in the input signal.

25. The buffer circuit of claim 24, wherein the duration of the delay generated by the delaying means determines the width of the first pulse signal.

26. The buffer circuit of claim 24, further comprising:
a second pulse generation means for turning on a second pulse signal responsive to a complement transition in the input signal;
a second delaying means for delaying the second pulse signal to generate a second delayed pulse signal; and
a second looping means for turning off the second pulse generation means responsive to the second delayed pulse signal;
and the output means is further configured to generate a signal responsive to the second pulse signal.

27. The buffer circuit of 26, wherein the duration of the delay generated by the second delaying means determines the width of the second pulse signal.

* * * * *